United States Patent
Tang et al.

(10) Patent No.: US 6,396,156 B1
(45) Date of Patent: May 28, 2002

(54) FLIP-CHIP BONDING STRUCTURE WITH STRESS-BUFFERING PROPERTY AND METHOD FOR MAKING THE SAME

(75) Inventors: Wen-Sen Tang, Changhwa; Shih-Kuang Chiu, Taichung, both of (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/656,572

(22) Filed: Sep. 7, 2000

(51) Int. Cl.[7] .......................... H01L 23/52; H01L 29/40; H01L 21/44
(52) U.S. Cl. .................. 257/779; 257/778; 257/780; 257/781; 438/612; 438/613; 438/614; 438/615
(58) Field of Search ................. 257/778–786; 361/704–705; 438/612–615

(56) References Cited

U.S. PATENT DOCUMENTS 6,028,365 A * 2/2000 Akram et al. ............... 257/778
6,236,568 B1 * 5/2001 Lai et al. ..................... 361/704

FOREIGN PATENT DOCUMENTS

JP           2-14536      *  1/1990

* cited by examiner

Primary Examiner—Ha Tran Nguyen
(74) Attorney, Agent, or Firm—Peter F. Corless; Steven M. Jensen; Edwards & Angell, LLP

(57) ABSTRACT

A flip-chip bonding structure with stress-buffering property is proposed, which can help prevent cracking and warpage to the flip-chip construction due to thermal stress. The proposed flip-chip bonding structure used to bond a flip chip to a substrate, and is characterized in the provision of a first electrically-conductive stress-buffering layer over the chip-side bond pad and a second electrically-conductive stress-buffering layer over the substrate-side bond pad, so that under high-temperature conditions, the thermal stress from the flip chip can be buffered by the first electrically-conductive stress-buffering layer, while the thermal stress from the substrate can be buffered by the second electrically-conductive stress-buffering layer, thus preventing cracking and warpage to the flip-chip construction. As a result, the finished flip-chip package can be more assured in quality and reliability than the prior art.

20 Claims, 3 Drawing Sheets

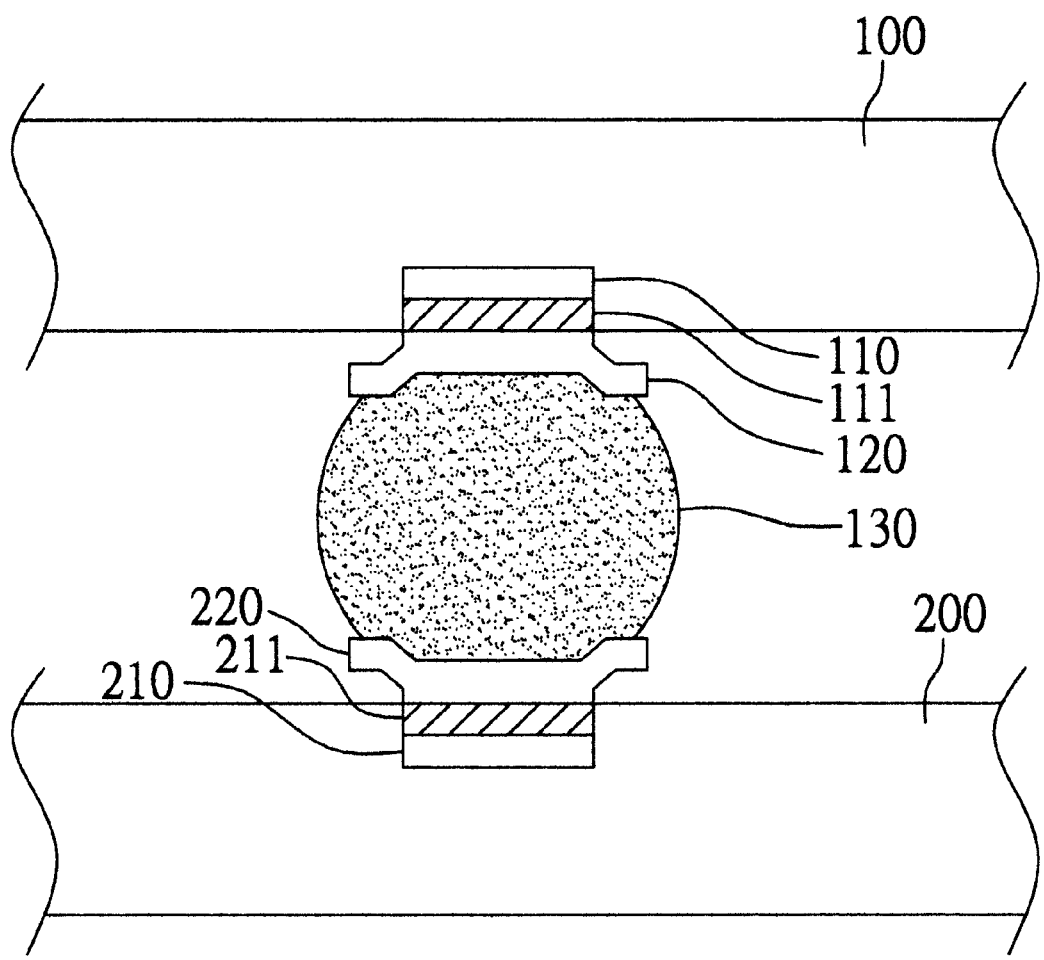

FLIP-CHIP BONDING STRUCTURE WITH STRESS-BUFFERING PROPERTY AND METHOD FOR MAKING THE SAME

BACKGROUND OF THE INVENTION

1. Field of the Invention

This invention relates to flip chip technology, and more particularly, to a flip-chip bonding structure with stress-buffering property that can help prevent cracking and warpage of the flip-chip construction due to thermal stress.

2. Description of Related Art

The flip-chip technology is an advanced semiconductor fabrication technology that allows the overall package size to be made very compact. The flip-chip package configuration differs from conventional ones particularly in that the semiconductor chip is mounted in an upside-down manner on substrate and electrical coupled to the same by means of solder bumps provided on the active surface of the semiconductor chip. Since no bonding wires are required, the overall size of the flip-chip package can be made very compact as compared to conventional types of package configurations.

One drawback to conventional flip-chip bonding structure, however, is that under high-temperature conditions, such as during subsequent encapsulation process, the solder bump would be easily broken up due to thermal stress from the flip chip and substrate, which may impair the mechanical bonding and electrically coupling between the flip chip and the substrate, making the finished flip-chip package unreliable to use. This drawback is illustratively depicted in the following with reference to FIG. 1.

FIG. 1 is a schematic sectional diagram used to depict a conventional flip-chip bonding structure for bonding a flip chip 10 to a substrate 20. As shown, this flip-chip bonding structure includes an aluminum-based bond pad 11 over the active surface of the flip chip 10, a UBM (Under Bump Metallization) layer 12 over the aluminum-based bond pad 11, and a solder bump 13 over the UBM layer 12. Furthermore, the flip-chip bonding structure includes a copper-based bond pad 21 over the top surface of the substrate 20, and a solder-wettable metallization structure, such as a Cu—Ni—Au metallization structure 22, over the copper-based bond pad 21.

The flip chip 10 is mounted in an upside-down manner over the substrate 20, with the solder bump 13 adhered to the Cu—Ni—Au metallization structure 22, which allows the flip chip 10 to be mechanically bonded and electrically coupled to the substrate 20.

One drawback to the forgoing flip-chip bonding structure, however, is that under high-temperature conditions, such as during subsequent encapsulation process, the solder bump 13 would be easily broken up, which may impair the mechanical bonding and electrically coupling between the flip chip 10 and the substrate 20, making the finished flip-chip package unreliable to use. This is because that there is a CTE (coefficient of thermal expansion) mismatch between the flip chip 10 and the substrate 20, and that the aluminum-based bond pad 11 and the UBM layer 12 over the flip chip 10 as well as the copper-based bond pad 21 and the Cu—Ni—Au metallization structure 22 over the substrate 20 are all highly rigid in material quality, thus allowing the thermal stress from the flip chip 10 and the substrate 20 to be straight transferred to the solder bump 13, causing a compressive force against the solder bump 13. As a result, the solder bump 13 would be easily broken up. Moreover, the thermal stress can cause cracking and warpage to the flip chip 10, the solder bump 13, and the substrate 20. If cracking of the solder bump 13 occurs, it may impair the mechanical bonding and electrically coupling between the flip chip 10 and the substrate 20, thus making the finished flip-chip package unreliable to use.

A great variety of patented technologies have been proposed for flip-chip, fabrication. A few of these patented technologies are listed in the following:

U.S. Pat. No. 5,904,859 entitled "FLIP CHIP METALLIZATION";

U.S. Pat. No. 5,902,686 entitled "METHODS FOR FORMING AN INTERMETALLIC REGION BETWEEN A SOLDER BUMP AND AN UNDER BUMP METALLURGY LAYER AND RELATED STRUCTURES";

U.S. Pat. No. 6,015,652 entitled "MANUFACTURE OF FLIP-CHIP DEVICE";

U.S. Pat. No. 5,137,845 entitled "METHOD OF FORMING METAL CONTACT PADS AND TERMINALS ON SEMICONDUCTOR CHIPS";

U.S. Pat. No. 5,173,359 entitled "INTERCONNECTION SYSTEM AND METHOD OF FABRICATION";

U.S. Pat. No. 5,736,456 entitled "METHOD OF FORMING CONDUCTIVE BUMPS ON DIE FOR FLIP CHIP APPLICATIONS";

U.S. Pat. No. 4,927,505 entitled "METALLIZATION SCHEME PROVIDING ADHESION AND BARRIER PROPERTIES";

U.S. Pat. No. 5,903,058 entitled "CONDUCTIVE BUMPS ON DIE FOR FLIP CHIP APPLICATION".

None of the above-listed patents, however, suggests a solution to the aforementioned thermal-stress problem in the flip-chip-bonding structure.

SUMMARY OF THE INVENTION

It is therefore an objective of this invention to provide a flip-chip bonding structure, which can help prevent cracking to the solder bumps due to thermal stress.

It is another objective of this invention to provide a flip-chip bonding structure, which can help prevent the flip-chip construction from warpage due to thermal stress.

It is still another objective of this invention to provide a flip-chip bonding structure, which allows the finished flip-chip package to be more assured in quality and reliability.

In accordance with the foregoing and other objectives, the invention proposes an improved flip-chip bonding structure with stress-buffering property that can help prevent cracking and warpage to the flip-chip construction due to thermal stress.

The flip-chip bonding structure of the invention comprises: (a) a chip-side bond pad formed over the flip chip; (b) a-first electrically-conductive stress-buffering layer laid over the chip-side bond pad; (c) a UBM layer laid over the first electrically-conductive stress-buffering layer; (d) a solder bump adhered to the UBM layer; (e) a substrate-side bond pad formed over the substrate; (f) a second electrically-conductive stress-buffering layer laid over the substrate-side bond pad; and (g) a solder-wettable metallization structure laid over the second electrically-conductive stress-buffering layer, and on which the solder bump is adhered.

The foregoing flip-chip bonding structure is characterized in the provision of the first electrically-conductive stress-buffering layer over the chip-side bond pad and the second electrically-conductive stress-buffering layer over the substrate-side bond pad, so that under high-temperature conditions, the thermal stress from the flip chip can be buffered by the first electrically-conductive stress-buffering-layer, while the thermal stress from the substrate can be buffered by the second electrically-conductive stress-buffering layer, thus allowing the flip-chip construction to be less likely subjected to cracking and warpage when undergoing high-temperature condition. The finished flip-chip package is therefore more assured in quality and reliability than the prior art.

BRIEF DESCRIPTION OF DRAWINGS

The invention can be more fully understood by reading the following detailed description of the preferred embodiments, with reference made to the accompanying drawings, wherein:

FIGS. 2A–2E are schematic sectional diagrams used to depict the process steps for fabricating the improved flip-chip bonding structure according to the invention.

DETAILED DESCRIPTION OF PREFERRED EMBODIMENTS

The improved flip-chip bonding structure according to the invention is disclosed by way of preferred embodiments in full details in the following with reference to FIGS. 2A–2E, which are used to show the process steps for fabricating the flip-chip bonding structure of the invention.

Figure 1:
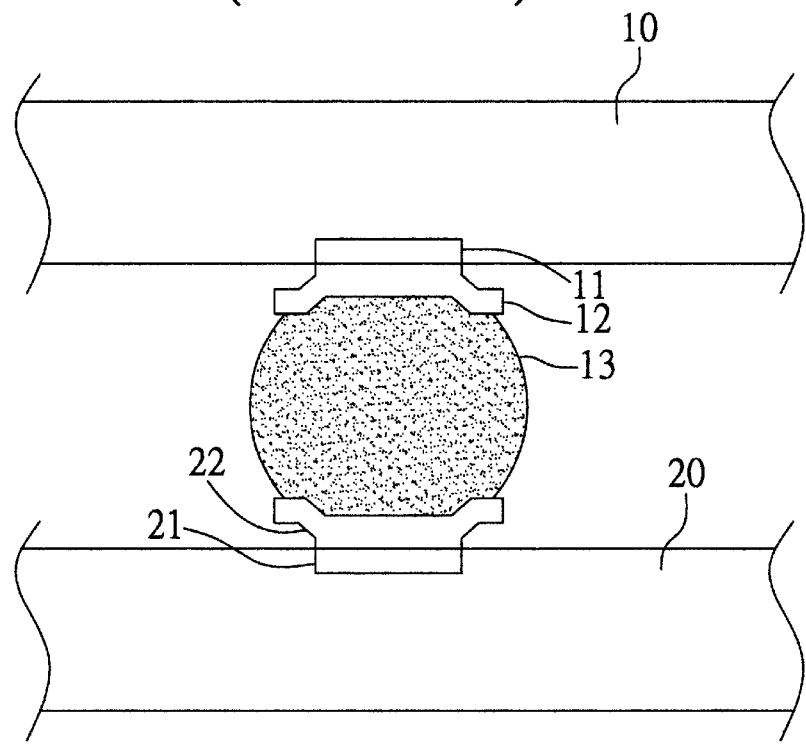
FIG. 1 (PRIOR ART) is a schematic sectional diagram used to depict a conventional flip-chip bonding structure.
Figure 2A:
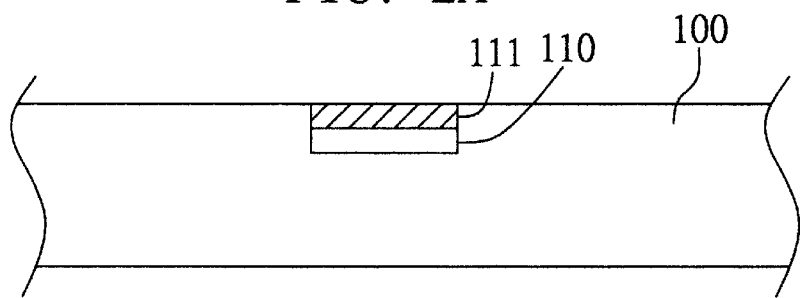
Figure 2A:
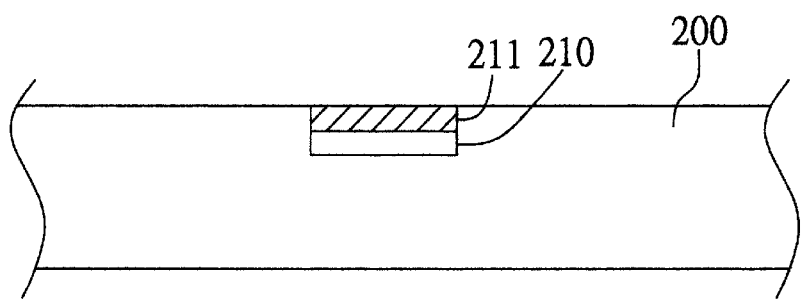

Referring to FIG. 2A, in the flip-chip fabrication process, the first step is to prepare a semiconductor chip 100 and a substrate 200 for flip-chip application.

The flip chip 100 is formed with a bond pad 110 (hereinafter referred to as a chip-side bond pad), such as an aluminum-based bond pad, which serves as an I/O pad for the internal circuitry (not shown) of the flip chip 100 (note that the actual flip chip would include a number of bond pads; but since these bond pads are all identical in structure, only one is demonstratively shown in FIG. 2A for simplification of drawings and description).

The substrate 200 is correspondingly formed with a bond pad 210 (hereinafter referred to as a substrate-side bond pad), such as a copper-based bond pad, which serves as a contact point for the corresponding I/O pad on the flip chip 100 (note that the actual substrate would include a number of bond pads; but since these bond pads are all identical in structure, only one is demonstratively shown in FIG. 2A for simplification of drawings and description).

Next, it is a characteristic feature of the invention that a first electrically-conductive stress-buffering layer 11 is formed over the chip-side bond pad 110, while a second electrically-conductive stress-buffering layer 211 is formed over the substrate-side bond pad 210. The first and second electrically-conductive stress-buffering layers 111, 211 are both made of a low-modulus electrically-conductive material, such as an electrically-conductive polymer, and which can be fabricated either through coating or through screen printing.

Figure 2B:
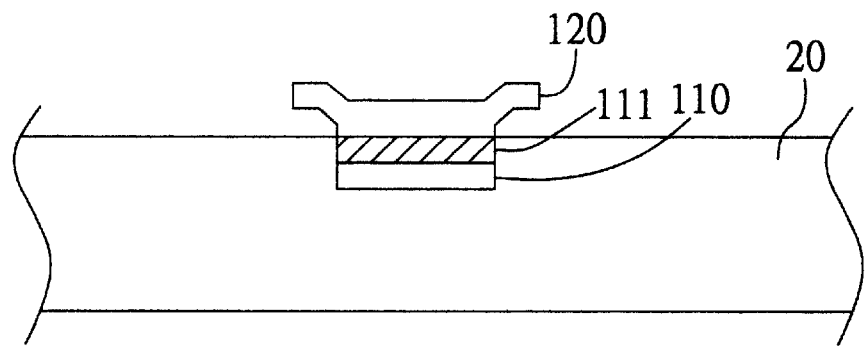

Referring further to FIG. 2B, in the next step, a UBM fabrication process is performed to fabricate a UBM layer 120 over the first electrically-conductive stress-buffering layer 111. The UBM fabrication process employs a conventional technique, and detailed steps thereof are not within the spirit and scope of the invention, so description thereof will not be further detailed.

Figure 2C:
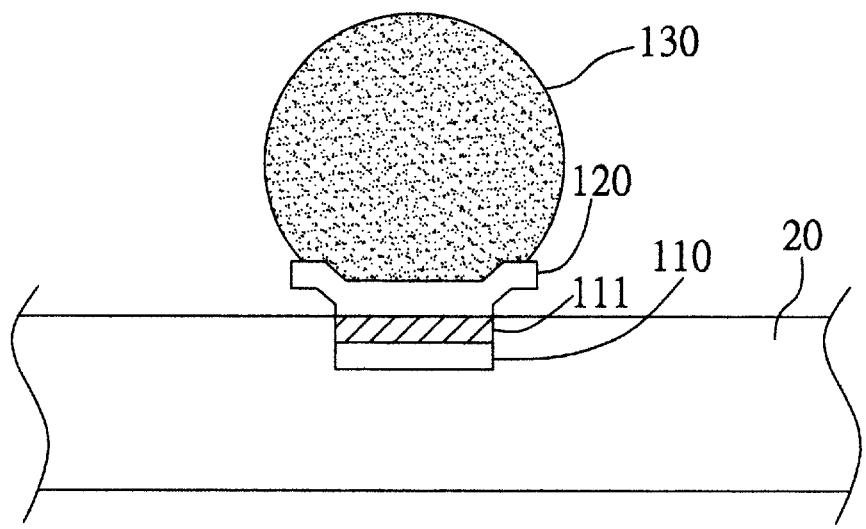

Referring further to FIG. 2C, in the next step, a solder-bump fabrication process is performed to form a solder bump 130 over the UBM layer 120. This solder-bump fabrication process also employs a conventional technique, and detailed steps thereof are not within the spirit and scope of the invention, so description thereof will not be further detailed.

Figure 2D:
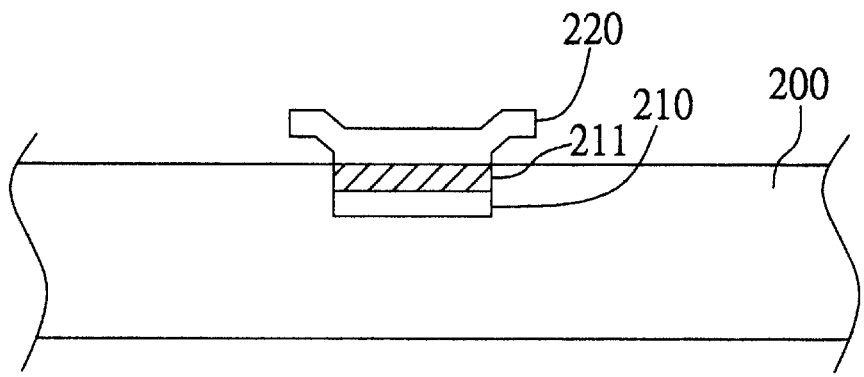

Referring further to FIG. 2D, as to the substrate 200, a metallization process is performed to fabricate a solder-wettable metallization structure, such as a Cu—Ni—Au metallization structure 220, over the second electrically-conductive stress-buffering layer 211, preferably through plating.

Referring further to FIG. 2E, in the next step, the flip chip 100 is mounted in an upside-down manner over the substrate 200, with the solder bump 130 adhered to the Cu—Ni—Au metallization structure 220 so as to securely bond and electrically coupling the flip chip 100 to the substrate 200. This completes the bonding of the flip chip 100 to the substrate 200 by means of the flip-chip bonding structure of the invention Under subsequent high-temperature conditions, such as during subsequent encapsulation process, the thermal stress from the flip chip 100 can be buffered by the first electrically-conductive stress-buffering layer 111, while the thermal stress from the substrate 200 can be buffered by the second electrically-conductive stress-buffering layer 211. Therefore, the provision of the first and second electrically-conductive stress-buffering layers 111, 211 can help reduce the thermal stress acting on the solder bump 130, thereby allowing the solder bump 130 to be less likely subjected to cracking when undergoing high-temperature conditions. Moreover, it can help prevent package warpage due to CTE mismatch between the flip chip 100 and the substrate 200. The finished flip-chip package can therefore be more assured in quality and reliability.

In conclusion, the invention provides an improved flip-chip bonding structure which is characterized in the provision of a first electrically-conductive stress-buffering layer over the chip-side bond pad and a second electrically-conductive stress-buffering layer over the substrate-side bond pad, so that under high-temperature conditions, the thermal stress from the flip chip can be buffered by the first electrically-conductive stress-buffering layer, while the thermal stress from the substrate can be buffered by the second electrically-conductive stress-buffering layer, thus preventing cracking and warpage to the flip-chip construction. As a result, the finished flip-chip package can be more assured in quality and reliability than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flip-chip bonding structure for bonding a flip chip to a substrate, which comprises:

(a) a chip-side bond pad formed over the flip chip;

(b) a first electrically-conductive stress-buffering layer laid over the chip-side bond pad;

(c) a UBM layer laid over the first electrically-conductive stress-buffering layer;

(d) a solder bump adhered to the UBM layer;

(e) a substrate-side bond pad formed over the substrate;

(f) a second electrically-conductive stress-buffering layer laid over the substrate-side bond pad; and (g) a solder-wettable metallization structure laid over the second electrically-conductive stress-buffering layer, and on which the solder bump is adhered.

2. The flip-chip bonding structure of claim 1, wherein the chip-side bond pad is an aluminum-based bond pad.

3. The flip-chip bonding structure of claim 1, wherein the first and second electrically-conductive stress-buffering layers are made of an electrically-conductive polymer.

4. The flip-chip bonding structure of claim 1, wherein the first and second electrically-conductive stress-buffering layers are fabricated through coating.

5. The flip-chip bonding structure of claim 1, wherein the first and second electrically-conductive stress-buffering layers are fabricated through screen printing.

6. The flip-chip bonding structure of claim 1, wherein the substrate-side bond pad is a copper-based bond pad.

7. The flip-chip bonding structure of claim 1, wherein the solder-wettable metallization structure is a Cu—Ni—Au metallization layer.

8. The flip-chip bonding structure of claim 7, wherein the Cu—Ni—Au metallization structure is fabricated through plating.

9. A flip-chip bonding structure for bonding a flip chip to a substrate, which comprises:

(a) an aluminum-based bond pad formed over the flip chip;

(b) a first electrically-conductive polymer layer laid over the chip-side bond pad;

(c) a UBM layer laid over the first electrically-conductive polymer layer;

(d) a solder bump adhered to the UBM layer;

(e) a copper-based bond pad formed over the substrate;

(f) a second electrically-conductive polymer layer laid over the substrate-side bond pad; and (g) a Cu—Ni—Au metallization structure laid over the second electrically-conductive polymer layer, and on which the solder bump is adhered.

10. The flip-chip bonding structure of claim 9, wherein the first and second electrically-conductive polymer layers are fabricated through coating.

11. The flip-clip bonding structure of claim 9, wherein the first and second electrically-conductive polymer layers are fabricated through screen printing.

12. The flip-chip bonding structure of claim 9, wherein the Cu—Ni—Au metallization structure is fabricated through plating.

13. A process for fabricating a flip-chip bonding structure for bonding a flip chip to a substrate, which comprises the steps of:

(1) forming a chip-side bond pad over the flip chip;

(2) forming a first electrically-conductive stress-buffering layer over the chip-side bond pad;

(3) forming a UBM layer over the first electrically-conductive stress-buffering layer;

(4) forming a solder bump directly on UBM layer;

(5) forming a substrate-side bond pad over the substrate;

(6) forming a second electrically-conductive stress-buffering layer over the substrate-side bond pad;

(7) forming a solder-wettable metallization structure over the second electrically-conductive stress-buffering layer; and (8) mounting the flip chip to the substrate, with the solder bump adhered to the solder-wettable metallization structure over the substrate.

14. The process of claim 13, wherein in said step (1), the chip-side bond pad is an aluminum-based bond pad.

15. The process of claim 13, wherein in said steps (2) and (6), the first and second electrically-conductive stress-buffering layers are made of an electrically-conductive polymer.

16. The process of claim 13, wherein in said steps (2) and (6), the first and second electrically-conductive stress-buffering layers are fabricated through coating.

17. The process of claim 13, wherein in said steps (2) and (6), the first and second electrically-conductive stress-buffering layers are fabricated through screen printing.

18. The process of claim 13, wherein in said step (5), the substrate-side bond pad is a copper-based bond pad.

19. The process of claim 13, wherein in said step (7), the solder-wettable metallization structure is a Cu—Ni—Au metallization layer.

20. The process of claim 19, wherein in said step (7), the Cu—Ni—Au metallization structure is fabricated through plating.

* * * * *